July 18, 1967 J. E. LARRISON 3,331,995

HOUSED SEMICONDUCTOR DEVICE WITH THERMALLY MATCHED ELEMENTS

Filed Feb. 25, 1964

INVENTOR.
JOHN E. LARRISON,
BY
W. Hugo Allister, Jr.
ATTORNEY.

United States Patent Office 3,331,995

Patented July 18, 1967

3,331,995

HOUSED SEMICONDUCTOR DEVICE WITH THERMALLY MATCHED ELEMENTS

John E. Larrison, Costa Mesa, Calif., assignor to Hughes Aircraft Company, Culver City, Calif., a corporation of Delaware Filed Feb. 25, 1964, Ser. No. 347,254
7 Claims. (Cl. 317—234)

Figure 1:
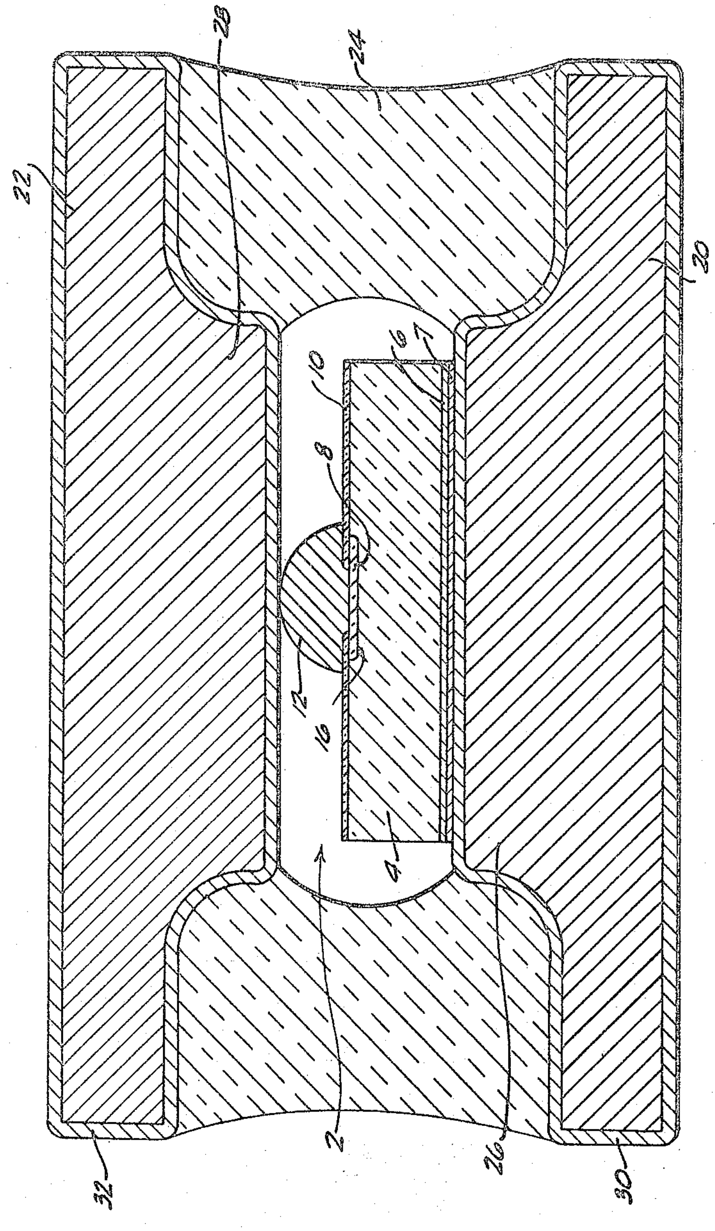

This invention relates to semiconductor devices and to the manufacture and assembly thereof for protection from deleterious environmental conditions. More particularly, the invention relates to containers or packages in which semiconductor devices may be hermetically sealed.

Semiconductor devices have been provided in many different kinds of containers ranging from plastic to metal to glass. One of the most successful packages has been the coaxial glass package disclosed and claimed in U.S. Patent No. 2,694,168 to H. Q. North et al. and assigned to the instant assignee, Hughes Aircraft Company. As semiconductor devices have become smaller and more sophisticated in electrical design much effort has been devoted to the problem of properly packaging the devices. Some of the requirements sought for in semiconductor packages are mutually inconsistent. Thus, it is desired not to subject the semiconductor crystal to excessive temperatures during the packaging thereof. At the same time it is desired to package the semiconductor device in an extremely small hermetic container. Thus if hermeticity of the package is attained by the use of heat, the semiconductor device therein is necessarily exposed to the sealing temperatures employed. It is also extremely desirable that the completely packaged semiconductor device be relatively insensitive to temperature variations during operation.

Package design considerations also require the use of a minimum number of parts which makes, in general, for a less expensive package and one of greater reliability. In addition, package ruggedness is desired which means a minimum number of wires or the like and other parts which might fail when the device is subjected to vibration and/or rapid acceleration or deceleration as when used in missiles and space vehicles. Improvement of the chances of surviving high temperatures during device operation also tends to dictate the utilization of package materials which requires high processing temperatures in their fabrication. These considerations lead one to consider the use of glass packaging and glass-to-metal seal techniques as did North et al. in the aforementioned patent.

In one of the more popular semiconductor diode devices commonly called a "planar" diode, a junction-forming region is usually submerged within a semiconductor body with only a very small surface area exposed on a plane surface of the semiconductor body. Typical dimensions of the semiconductor body containing such a junction-forming region are .020" x .020" x .003". The hermetic packaging of such a planar device while meeting the foregoing package requirements and also attaining the necessary electrical connections to the junction-forming region on one side of the semiconductor body and to the bulk of the semiconductor body on the opposite side have proven to be exceptionally difficult achievements. This is especially true for devices wherein the junction-forming region is established by the diffusion of an impurity through a small window or opening in a non-conductive mask or oxide which is left permanently in place on the semiconductor device for the purpose of protecting the surface thereof and especially the rectifying junction which extends to the surface.

In the coaxial lead glass package of the prior art the electrical connection from one of the coaxial leads to the junction-forming region was usually attained by means of a resilient whisker or the like which was welded to one of the coaxial leads. Upon the hermetic sealing of the package the resilient whisker was maintained in pressure contact with a metallic button alloyed to the semiconductor body and particularly to the junction-forming region thereof. It will be appreciated that in many instances the employment of such a resilient wire or whisker offers some significant mechanical disadvantages, such as mentioned previously. Understandably then the industry has been seeking the attainment of a package for semiconductor devices such as diodes in which the use of pressure-contact wires or whiskers and the like for electrical connections are eliminated. What is desired is a "whiskerless," bonded type connection.

A proposed package meeting these requirements would mount the semiconductor body on a metallic cap member which serves both as a part of the package as well as an electrical connection to the junction-forming region of the semiconductor device. A metallic button or "bump" fused to the junction-forming region of the semiconductor device is provided between this region and the metallic cap member. The semiconductor body is also bonded on its "back" or opposite side to a second metallic cap member. Because of the differences in the conductivity types of the junction-forming region and the "back" contact side of the semiconductor body, different types of bonding agents or techniques are required to achieve bonds between the semiconductor device and these similar metallic cap or terminal members. Thus this sub-assembly itself involves some obvious problems in obtaining the necessary thermal matches. If now a complete assembly is attempted whereby the metallic cap members are hermetically sealed by means of glass or other such insulating envelope materials with the semiconductor device disposed inside, further complications are encountered. Thus, the metallic cap members must be joined to the glass envelope by means of glass-to-metal seals at the peripheral portions thereof, for example. At the same time these same cap members must also be bonded to the intervening semiconductor body for the desired electrical connections thereto by means of a metal-to-metal and semiconductor-to-metal bonds. Thus, if integrity of the package and of the electrical bonds and connections are to be maintained during widely different temperature environments, for example, it is necessary that there be exceptionally close matches between the thermal coefficients of expansion of the metallic terminal members, the glass envelope, and the semiconductor body including the metallic button or bump. Thus, thermal matching of at least several different materials or combinations is required.

These difficulties have been overcome by the utilization of a glass envelope which has a coefficient of expansion substantially matching that of the semiconductor body including the metallic connections thereto. Thus the expansions and contractions of the various items disposed between the metallic cap members during temperature changes are substantially equal so that strains and ruptures in the seals therebetween are eliminated. However, since the metallic cap members must be capable of forming glass-to-metal seals or bonds as well as metal-to-metal bonds, difficulty in attaining good bonds or fused connections between the terminal cap members and the semiconductor body and especially to the metallic contact button on the surface thereof was encountered. The relatively rapid and extensive oxidation of the terminal cap members during the step of fusing these members to the glass envelope precluded the requisite bonding between these cap members and the respective metallic parts of the semiconductive device. Thus, while this oxide and/or its formation during the package-sealing step appears to be advantageous as far as attaining glass-to-metal seals is concerned, it offers a severe disadvantage as far as attaining the required metal-to-metal seals.

It is therefore an object of the present invention to provide an improved package for semiconductor devices wherein package hermeticity is attained by the use of glass-to-metal seals while simultaneously attaining metal-to-metal bonds between metal portions of the package and the semiconductor device therewithin.

Another object of the invention is to provide an improved package for semiconductor diode devices in which electrical connections to the semiconductor device are provided by metal-to-metal bonds between elements of the semiconductor device and metallic portions of the package while hermeticity of the package is achieved by glass-to-metal bonds to these metallic portions of the package.

Still another object of the invention is to provide an improved method for hermetically sealing a semiconductor device within a package by glass-to-metal seals while simultaneously providing metal-to-metal bonds between the package and elements of the semiconductor device.

These and other objects and advantages of the invention are achieved by providing a semiconductor device body with a metallic layer bonded thereto on one surface and a metallic button element or "bump" bonded to the junction-forming region on the opposite surface thereof. The metalllic layer and the button element are bonded, respectively, to and between first and second terminal cap members. Between the two terminals cap members and surrounding the semiconductor device a glass envelope is provided which has a coefficient of expansion substantially equivalent to that of the terminal cap members as well as to that of the semiconductor body including the metallic button element thereof. These four elements—(1) the first metallic cap member, (2) the second metallic member, (3) the semiconductor device, and (4) the glass envelope—are assembled and subjected to a single heat treatment which results in the formation of hermetic glass-to-metal seals between the glass envelope member and the metallic cap members as well as metal-to-metal bonds betwen the metallic layer and button portions of the semiconductor device and the respective metallic cap member. The metal-to-metal seals as well as the glass-to-metal seals are obtained without interference by oxidation of the metallic parts involved due to the provision of a metal plating on the metallic cap members which does not impair the necessary glass-to-metal bonds. If this metal plating does oxidize it is believed that the oxide either disappears as by vaporization or decomposition by the time the metal-to-metal bonding temperatures and/or conditions are reached, or the oxide is efficacious in promoting metal-to-metal bonding.

Figure 2:
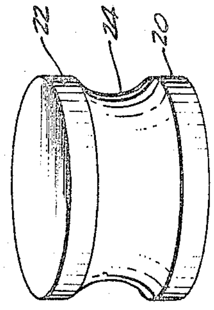

The invention will be described in greater detail by reference to the drawings in which:

FIGURE 1 is a cross-sectional elevational view of a typical semiconductor device mounted in an hermetic glass package according to the present invention; and FIGURE 2 is an overall perspective view of a semiconductor diode device package according to the present invention.

Referring now to the drawings, a typical semiconductor diode device is shown completely packaged according to the invention. The diode device 2 may comprise, for example, a silicon crystal member 4 the bulk of which may be of N-type conductivity. The "back" surface of the silicon member or die 4 may be provided with a gold-silicon eutectic layer 6 by previous processing, as is well known in the art of semiconductor device fabrication, in order to insure a good ohmic connection to the N-type semiconductor die 4. The gold-silicon eutectic layer 6 may be provided for evaporating a thin layer of gold onto the back surface of the silicon body while maintaining this body at the gold-silicon eutectic temperature. Thereafter, by conventional techniques, a thin layer 7 of silver may be electroplated over the gold-silicon layer 6.

The remainder of the diode device 2 comprises a diffused P-type junction-forming region 8 disposed on an upper surface of the semiconductor die 4 with a protective non-conductive coating 10 disposed over portions thereof including especially those portions where the junction between the P-type region 8 and the bulk of the N-type body 4 extends to the surface of the semiconductor die. This junction-forming P-type region 8 may be formed prior to assembly of the device 2 in the package by masking the upper surface of the silicon die 4 to form the non-conductive coating 10 as by oxidizing this surface. A portion of this coating may then be removed, as by etching, to form an opening or window therein. Thereafter the thus-masked surface of the semiconductor die is exposed to a diffusion atmosphere containing in vapor form a P-type conductivity-type-determining impurity such as boron, for example. By the process of diffusion the impurity establishes the P-type region 8 through the opening in the mask. A P-N rectifying junction 16 is thus formed under the protective oxide layer 10 which is left in situ. This process is well-known in the art and is fully described in U.S. Patents 2,802,760 to Derick and Frosch and 3,025,589 to Hoerni.

As taught in the copending application of Saia and Quetsch, Ser. No. 327,647, filed Dec. 3, 1963, and assigned to the instant assignee, an electrical contact to the P-type region 8 is provided by means of a metal fill or "bump" 12 through the opening in the non-conductive mask 10. Semiconductor devices such as shown are extremely small, the area of the surface of the die member 4 containing the junction-forming region 8 being about 400 sq. mils. In such a device it is customary that the opening in the nonconductive mask 10 be only about 3.5 mils in diameter. Thus one is presented with the rather difficult and tedious operation of providing an electrical connection between the exposed surface of the die member through the window in the non-conductive mask 10 and a lead or terminal member. Such connection is provided according to the aforementioned application of Saia and Quetsch by a process termed "brush" or immersionless electroplating which will be described in somewhat greater detail hereinafter.

While a single such device may be fabricated on a single semiconductor body, it has been found more convenient and economical to perform the required fabrication processes on a large wafer or semiconductor material to form a plurality of rectifying junction devices simultaneously and thereafter "dice" the wafer to obtain separate devices or dice. However, it should be understood that though the process of the invention is described as being performed on a semiconductor wafer, the practice is by no means limited thereto.

Describing the fabrication of the diode device 2 in more detail a semiconductor wafer, which may be of silicon and about 3.0 mils thick and 1.25 in. in diameter and of N-type conductivity, may be disposed in an oxidizing atmosphere so as to convert at least one surface thereof to an oxide of the semiconductor material. In this manner the non-conducting layer 10 comprising $SiO_2$, for example, is formed. The semiconductor wafer may have been formed or grown by the epitaxial process or it may be a wafer cut from an ingot of semiconductor material which was grown from a doped melt. While the use of an oxide of the semiconductor material comprising the wafer is preferable because of its inertness and excellent masking properties against conductivity-type-determining impurities, the mask 10 could be formed of any suitable non-conducting material by other processes. The formation of such oxide layers is well known in the art and is amply described, for example, in the aforementioned patent to Derick and Frosch.

A pattern of holes is formed in the non-conducting layer 10 by means of well-known photo-resist techniques so as to expose desired portions of the oxide layer through an etch-resistant coating. The non-conducting material exposed through holes in the etch-resistant coating may then be removed as by etching with hydrofluoric acid in the case of silicon oxide, for example, to expose portions of the surface of the silicon wafer through the holes. The etch-resistant coating may then be removed altogether. Alternatively, it is possible to form the openings through the non-conducting layer 10 by mechanical engraving or scribing techniques.

The wafer is then exposed to an atmosphere containing vapors of a conductivity-type-determining impurity whereby the impurity diffuses into the surface of the wafer through the openings in the non-conducting layer or mask 10. In the present example, where the wafer is of N-type conductivity, a P-type impurity such as boron may be employed so as to establish a P-type conductivity region 8 beneath each hole in the non-conducting mask 10, each region forming a rectifying barrier 16 with the bulk of the N-type silicon wafer. It will be appreciated that the practice of the present invention is not limited to any particular arrangement of N-type and P-type regions and that the wafer could be of P-type conductivity, in which case an N-type impurity would be diffused therein through the non-conducting mask 10 to form N-P rectifying barriers, for example. In either instance, the rectifying barriers 16 thus-formed extend to the surface of the wafer and under the protective mask 10.

Previously at this point it was the practice to "dice" the wafer so as to separate each junction-forming portion thereof and to provide individual dice for further device fabrication, it being common to make connections to the junction-forming regions 8 by means of wires or whiskers and the like as by thermo-compression bonding techniques. However, such procedures have proven either economically undesirable or extremely difficult and tedious of accomplishment, especially as the desire for small devices has increased. If vapor deposition techniques are used for this purpose it is extremely difficult and time-consuming to build-up the desired thickness of metal while confining this metal to only the exposed surfaces in the holes of the non-conductive mask. As noted previously in devices of the present example, the opening through the mask 10 may be typically only 3.5 mils in diameter making it exceptionally difficult to provide electrical connections therethrough.

It will thus be understood that a plurality of rectifying devices have been provided in the silicon wafer. Electrical connections to the junction-forming regions 8 are efficiently and economically provided by the aforementioned process of "brush" electroplating. The "brush" comprises a core or rod of electrically conductive material on which is mounted an absorbent element or sleeve of cotton wadding soaked or saturated with a suitable metal-plating solution. The brush core is electrically connected into a plating circuit with a plating power supply to which the back surface or ohmic layer 6 of the semiconductor wafer is also connected. Plating into the holes of the non-conductive mask 10 and onto the exposed surfaces of the junction-forming regions 8 is accomplished by sweeping the brush back and forth across the non-conductive layer and the holes therein which action results in gradually building up a mass 12 of plated metal in each hole in good electrical contact with the junction-forming regions 8 exposed therethrough and strongly adherent thereto. The wiping or sweeping action can be continued to build-up a relatively high mound or "bump" of suitable metal such as silver, for example. Criteria governing the tailoring of the height of this metal button or bump element will be described in greater detail hereinafter. After achieving the desired height of the mound or bump of metal, the wafer may than be diced as by scribing and etching or by sawing to form a plurality of semiconductor devices each containing a rectifying junction-forming region 8 protected by a non-conductive mask 10 and having an electrical connection to the junction-forming region 8 constituted by a "bump" of metal 12, thus constituting the device 2 which is ready for subsequent packaging according to the present invention.

The package or container for the device just described comprises a pair of opposed terminal cap members 20 and 22 bonded together at their peripheries by means of a glass wall portion or envelope 24 with the semiconductor device 2 therewithin and therebetween. The cap members 20 and 22 are of metal and are each provided with centrally disposed mesa or pedestal portions 26 and 28, respectively. For purposes of illustration, typical dimensions of a suitable cap member may be as follows:

| | Inch |
|---|---|
| Overall diameter | 0.0625 |
| Mesa diameter | 0.032 |
| Overall height | 0.013 |
| Height of mesa only | 0.007 |

For a package using end caps having such dimensions a glass envelope body or ring having an initial outside diameter of about 0.057" and an inside diameter of about 0.036" may be utilized, the height of this glass ring being typically about 0.026".

A suitable glass for the package of the present invention is a high lead glass identified as "Glass Code 8870" by Corning Glass Works of Corning, New York, the manufacturer thereof. This glass has a coefficient of thermal expansion of approximately $91 \times 10^{-7}$ per degree centigrade.

The metallic end cap members 20 and 22 may be formed of a glass-sealing metal consisting essentially of an alloy of iron and nickel in equal proportions by weight. Cap members made of this alloy have a coefficient of expansion of approximately $93 \times 10^{-7}$ per degree centigrade, which matches that of the glasses used for the glass body part 24. It will thus be understood that the glass and the cap members are matched in thermal expansion to approximately 20 parts per million. In glass-to-metal sealing technology thermal matches of less than 500 parts per million are considered good while matches of less than 100 parts per million are considered excellent. During the heating of the glass body 24 in contact with such an alloy element, however, the cap members tend to readily oxidize which would, except for the present invention, severely reduce the ability to achieve metal-to-metal bonds or soldering action to such end cap members. On the other hand, such oxides are apparently efficacious in promoting excellent mechanical and gas tight bonds to glass bodies such as intended to be used in the package of the present invention. It has been found according to the present invention that these end cap members may be plated with silver so as to inhibit or avoid the deleterious effects of such oxidation of the metal of these cap members while at the same time achieving excellent sealing of the glass body part to these cap members. In addition, the silver plating readily bonds with the metals forming the contact portions or connections on the semiconductor device 2. While the silver may oxidize during the heating of the assembly it is believed that the silver oxide formed either aids in the desired seals or is no longer present when the sealing temperatures are reached. As shown in the drawings, the end cap members 20 and 22 are provided with platings 30 and 32 by conventional silver electroplating techniques over their entire surfaces which plating may be about 0.0007" in thickness. It is only necessary, however, to plate the surfaces to which the respective bonds and seals are to be made. Due to the small size of the cap members it is economically feasible and convenient to plate all of the surfaces of these members.

The package assembly shown in the drawing is achieved by placing the silicon semiconductor device 2 on the pedestal portion 26 of an end cap member 20 with the silver-plated layer 7 of the semiconductor device 2 being in contact with the silver layer 30 on the mesa portion 26 of the cap member 20. The ring-like glass part 24 is then placed on the peripheral portions of the cap member 20 and the upper cap member 22 is placed with its pedestal portion 28 extending downwardly within the glass member 24. It will be appreciated that the glass member 24 maintains the terminal cap members 20 and 22 well apart from each other; especially is the pedestal portion 28 of the upper cap member 22 maintained at a significant distance from the button or "bump" contact member 12 on the upper surface of the semiconductor device 2 so that these two do not contact each other at this stage of assembly and fabrication. The assembly is then placed in an oven or any other desired heating apparatus and raised to a temperature at which the glass body 24 softens and seals to the metallic cap members 20 and 22. During this sealing operation the glass body 24 loses its heretofore substantially symmetrical-cylindrical shape and tends to slump down to assume more or less the shape shown in the drawing. This slumping down of the glass body 24 permits the upper cap member 22 to drop downwards toward the lower cap member 20 so that the silver plated pedestal 28 of the upper cap member 22 contacts and bonds to the metal button or "bump" element 12 on the semiconductor device 2. To enhance this action and to ensure that the upper cap member does in fact come down sufficiently to ensure contact to the metal connector 12, it may be desirable to place a weight on the assembly during this heating operation.

Utilizing metal cap members of the aforementioned alloy and a glass body 24 of Corning Glass Number 8870 an hermetically sealed package may be obtained and bonded connections provided between the upper cap member 22 to the connector element 12 and between the lower cap member 20 and the back surface 6 of the semiconductor device by heating the assembly to a maximum temperature of 710° C. degrees for 3–5 minutes. Thereafter the assembly may be cooled to room temperature at the rate of 38° C. per minute.

From the foregoing it will be appreciated that there is a substantial thermal match between the glass body 24 and the terminal cap members 20 and 22. It was also previously stated that the height of the metal bump 12 could be tailored in order to achieve the desired thermal match between the semiconductor device 2 (including the metal button 12) to the terminal end cap members 20 and 22. This is necessary if good electrical and mechanical bonds are to be maintained betwen the various parts of the apparatus shown during different temperature environments. Thus it can be considered that the cap members 20 and 22 are bonded together by two elements: by the glass body 24 and the semiconductor device 2. Since thermal matching of the cap members and the glass body 24 has already been achieved as indicated, it remains to provide the semiconductor device with a thermal match or coefficient of expansion corresponding substantially to that of the glass envelope 24 and particularly to the section thereof corresponding in height to the height of the semiconductor device. Thus if this section and the semiconductor device expand and contract in substantially the same fashion no stresses or strains will be placed on the bonds and seals to the terminal cap members.

Assuming the height of the glass body section which corresponds to the height of the semiconductor device 2 including the silver bump 12 to be 8.5 mils, the thermal expansion of this section of the glass body will equal $91\times10^{-7}$ in./in./°C. If now the height of the silicon body is 5.5 mils with a coefficient of expansion of $47\times10^{-7}$ in./in./°C. and the height of the silver bump 12 is 3 mils with a coefficient of expansion of $188\times10^{-7}$ in./in./°C. the combination of 5.5 mils of silicon and 3.0 mils of silver will have a coefficient of expansion of $96\times10^{-7}$ in./in./°C. The difference between the coefficients of expansion of the glass body 24 and the semiconductor body (silicon die and silver bump) is $(96\times10^{-7})$ minus $(91\times10^{-7})$ or $5\times10^{-7}$ which is 50 parts per million. This is generally considered to be an excellent thermal match. By choosing the proper proportions of silicon height and silver bump height a thermal match can be achieved according to this invention for any device and/or package dimensions.

In the foregoing description it is stated that a bond is achieved between the silver plating on the end cap members 20 and 22 to the silver connecting element 12 and silver layer 7 on the semiconductor device 2. Since a temperature of about 710° C. is employed it will be appreciated that the bonds in the instant example are not of the alloy or solder type although this type of bond is not necessarily precluded from use in the present invention. The kind of bond that is achieved is best described metallurgically as an interdiffusion bond by which is meant a bond obtained by the diffusion of the atoms of the two metal components into each other under the influence of pressure and temperature without the establishment of a molten phase. As used herein and in the appended claims the phrase "metallurgically bondable" is intended to include metals which can be bonded together by the process of interdiffusion as well as by soldering or alloying. In every instance wherein one metal article is bonded to another it is necessary that some diffusion occur and since diffusion can take place only in a solid solution, only metals that have appreciable solid solubility can be bonded. See Guy "Elements of Physical Metallurgy" (Addison-Wesley Publishing Company, Reading, Mass., 1959 at page 411). Thus the phrase "metallurgically bondable" as used herein necessarily means metals that have appreciable solid solubility.

It will thus be appreciated that in a single heating operation not only have the glass-to-metal seals for the package been obtained but simultaneously the metallurgical bonds to the semiconductor device and the terminal members of the package are provided. It will also be appreciated that it is possible to solder or otherwise make suitable circuit connections to the exterior surfaces of the opposed cap members 20 and 22 as desired. The achievement of complete assembly in one heating operation drastically reduces the amount of handling required by operators thus speeding up the production and reducing the costs thereof. Furthermore, the identity and symmetry of the parts required in this package further enhance the assembly and reduce the cost thereof. It will also be appreciated that the package of the present invention not only is whiskerless but also provides bonded electrical connections to the operative portions of the semiconductor device.

What is claimed is:

1. Semiconductor apparatus comprising, in combination:
- (A) a container for a semiconductor device comprising:
  - (1) a hollow glass member having a predetermined coefficient of thermal expansion;
  - (2) a pair of metallic terminal members hermetically bonded to the open ends of said glass member and having:
    - (a) a coefficient of thermal expansion substantially equal to said predetermined coefficient of expansion; and
    - (b) a metallurgically bondable metallic plating on at least the surfaces thereof to which said glass member is bonded;
- (B) a semiconductor device disposed within said glass member comprising:
  - (1) a semiconductor body having a first surface bonded to said plating on one of said terminal members; and
  - (2) a metallurgically bondable connecting member;
    - (a) bonded to a second surface of said semiconductor body and to said plating on the other of said terminal members;
    - (b) and having a height such that the sum of the thermal expansions of said connecting member and said semi-conductor body is equal to the thermal expansion of said glass member between said terminal members.

2. Semiconductor apparatus comprising, in combination:
(A) a container for a semiconductor device comprising:
(1) a hollow glass member having a predetermined coefficient of thermal expansion;
(2) a pair of metallic alloy terminal members hermetically bonded to the open ends of said glass member and having:
(a) a coefficient of thermal expansion substantially equal to said predetermined coefficient of expansion; and
(b) a silver plating on at least the surfaces thereof to which said glass member is bonded;
(B) a semiconductor device disposed within said glass member comprising:
(1) a silicon semiconductor body having a first surface bonded to said silver plating on one of said terminal members; and
(2) a silver connecting member:
(a) bonded to a second surface of said silicon semiconductor body and to said silver plating on the other of said terminal members;
(b) and having a height such that the sum of thermal expansions of said connecting member and said silicon semiconductor body is equal to the thermal expansion of said glass member between said terminal members.

3. Semiconductor apparatus comprising, in combination:
(A) a container for a semiconductor device comprising:
(1) a hollow glass member having a predetermined coefficient of thermal expansion;
(2) a pair of metallic terminal members hermetically bonded to the open ends of said glass member and having:
(a) a coefficient of thermal expansion substantially equal to said predetermined coefficient of expansion; and
(b) pedestal portions on the surfaces thereof which extend into said glass member;
(c) a metallurgically bondable metallic plating on said pedestal portions and the surfaces to which said glass member is bonded;
(B) a semiconductor device disposed within said glass member comprising:
(1) a semiconductor body having a first surface bonded to said plating on the pedestal portion of one of said terminal members; and
(2) a metallurgically bondable connecting member:
(a) bonded to a second surface of said semiconductor body and to said plating on the pedestal portion of the other of said terminal members;
(b) and having a height such that the sum of the thermal expansions of said connecting member and said semiconductor body is equal to the thermal expansion of said glass member between said terminal members.

4. Semiconductor apparatus comprising, in combination:
(A) a container for a semiconductor device comprising:
(1) a hollow glass member having a predetermined coefficient of thermal expansion;
(2) a pair of metallic terminal members hermetically bonded to the open ends of said glass member and having:

(a) a coefficient of thermal expansion substantially equal to said predetermined coefficient of expansion; and
(b) pedestal portions on the surfaces thereof which extend into said glass member;
(c) a silver plating on said pedestal portions and the surfaces to which said glass member is bonded;
(B) a semiconductor device disposed within said glass member comprising:
(1) a silicon semiconductor body having a first surface bonded to the silver plating on the pedestal portion of one of said terminal members; and
(2) a silver connecting member:
(a) bonded to a second surface of said silicon semiconductor body and to the silver plating on the pedestal portion of the other of said terminal members;
(b) and having a height such that the sum of thermal expansions of said connecting member and said silicon semiconductor body is equal to the thermal expansion of said glass member between said terminal members.

5. Semiconductor apparatus comprising, in combination:
(A) a container for a semiconductor device comprising:
(1) a hollow glass member having a predetermined coefficient of thermal expansion;
(2) a pair of oxidizable metallic terminal members hermetically bonded to the open ends of said glass member and having:
(a) a coefficient of thermal expansion substantially equal to said predetermined coefficient of expansion; and
(b) a metallurgically bondable metallic plating on at least the surfaces thereof to which said glass member is bonded;
(B) a semiconductor device disposed within said glass member comprising:
(1) a semiconductor body having:
(a) a first surface bonded to said plating on one of said terminal members;
(b) a diffused region on a second surface of said semiconductor body;
(c) a non-conducting protective coating on said surface; and
(d) an opening in said non-conducting surface exposing a portion of said diffused region;
(2) a metallurgically bondable connecting member:
(a) bonded to said diffused region through said opening in said non-conducting layer and to said plating on the other of said terminal members;
(b) and having a height such that the sum of the thermal expansion of said connecting member and said semiconductor body is equal to the thermal expansion of said glass member between said terminal members.

6. Semiconductor apparatus comprising, in combination:
(A) a container for a semiconductor device comprising:
(1) a hollow glass member having a predetermined coefficient of thermal expansion;
(2) a pair of metallic terminal members hermetically bonded to the open ends of said glass member and having:
(a) a coefficient of thermal expansion substantially equal to said predetermined coefficient of expansion; and (b) a silver plating on at least the surfaces thereof to which said glass member is bonded;

(B) a semiconductor device disposed within said glass member comprising:

(1) a silicon semiconductor body having:

(a) a first surface bonded to said silver plating on one of said terminal members;

(b) a diffused region on a second surface of said silicon semiconductor body;

(c) a non-conducting protective coating on said second surface; and (d) an opening in said non-conducting surface exposing a portion of said diffused region.

(2) a silver connecting member:

(a) bonded to said diffused region through said opening in said non-conducting layer and to the silver plating on the other of said terminal members;

(b) and having a height such that the sum of the thermal expansion of said connecting member and said silicon semiconductor body is equal to the thermal expansion of said glass member between said terminal members.

7. Semiconductor apparatus comprising, in combination:

(A) a container for a semiconductor device comprising:

(1) a hollow glass member having a predetermined coefficient of thermal expansion;

(2) a pair of metallic terminal members hermetically bonded to the open ends of said glass member and having:

(a) a coefficient of thermal expansion substantially equal to said predetermined coefficient of expansion;

(b) and pedestal portions on the surfaces thereof which extend into said glass member; and (c) a silver plating on said pedestal portions the surfaces to which said glass member is bonded;

(B) a semiconductor device disposed within said glass member comprising:

(1) a silicon semiconductor body having:

(a) a first surface bonded to said silver plating on one of said terminal members;

(b) a diffused region on a second surface of said silicon semiconductor body;

(c) a non-conducting protective coating on said second surface; and (d) an opening in said non-conducting surface exposing a portion of said diffused region.

(2) a silver connecting member:

(a) bonded to said diffused region through said opening in said non-conducting layer and to the silver plating on the pedestal portions of the other of said terminal members;

(b) and having a height such that the sum of the thermal expansion of said connecting member and said silicon semiconductor body is equal to the thermal expansion of said glass member between said terminal members.

References Cited

UNITED STATES PATENTS

| | | | |
|---|---|---|---|
| 2,972,092 | 2/1961 | Nelson | 317—235 |
| 3,001,113 | 9/1961 | Mueller | 317—236 |
| 3,010,057 | 11/1961 | Albert | 317—234 |
| 3,030,557 | 4/1962 | Dermit | 317—234 |
| 3,116,443 | 12/1963 | Forster et al. | 317—234 |
| 3,200,310 | 8/1965 | Carman | 317—234 |
| 3,241,011 | 3/1966 | DeMille et al. | 317—234 |
| 3,265,805 | 8/1966 | Carlan et al. | 317—234 X |

JOHN W. HUCKERT, *Primary Examiner.*

JAMES D. KALLAM, *Examiner.*

A. M. LESNIAK, *Assistant Examiner.*